(12) United States Patent
Pruijmboom et al.

(10) Patent No.: US 9,065,235 B2
(45) Date of Patent: Jun. 23, 2015

(54) METHOD OF ASSEMBLING VCSEL CHIPS ON A SUB-MOUNT

(71) Applicant: KONINKLIJKE PHILIPS N.V., Eindhoven (NL)

(72) Inventors: Armand Pruijmboom, Wijchen (NL); Raimond Louis Dumoulin, Maarheeze (NL); Michael Miller, Ulm (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/350,404

(22) PCT Filed: Oct. 8, 2012

(86) PCT No.: PCT/IB2012/055432
§ 371 (c)(1),
(2) Date: Apr. 8, 2014

(87) PCT Pub. No.: WO2013/054249
PCT Pub. Date: Apr. 18, 2013

(65) Prior Publication Data
US 2014/0348192 A1    Nov. 27, 2014

Related U.S. Application Data

(60) Provisional application No. 61/545,213, filed on Oct. 10, 2011.

(51) Int. Cl.
*H01S 5/022* (2006.01)
*H01S 5/028* (2006.01)
(Continued)

(52) U.S. Cl.
CPC ............ *H01S 5/02236* (2013.01); *H01L 24/04* (2013.01); *H01L 24/05* (2013.01);
(Continued)

(58) Field of Classification Search
CPC . H01S 5/02236; H01S 5/02469; H01S 5/423; H01S 5/3013; H01S 5/028; H01L 25/0753; H01L 27/156
USPC .................. 372/36, 50.124; 438/28
See application file for complete search history.

(56) References Cited

U.S. PATENT DOCUMENTS

2009/0129422 A1    5/2009   Edris et al.
2010/0027577 A1    2/2010   Dutta

OTHER PUBLICATIONS

Hendrik Roscher et al; "Toward Redundant 2-D CSEL Arrays for Optical Datacom", Proceedings SPIE, 2004, vol. 5453, Bellingham, WA, USA, XP040186412.

(Continued)

*Primary Examiner* — Armando Rodriguez
(74) *Attorney, Agent, or Firm* — Yuliya Mathis

(57) ABSTRACT

The present invention relates to a method of assembling VCSEL chips (1) on a sub-mount (2). A de-wetting layer (13) is deposited on a connecting side of the VCSEL chips (1) which is to be connected to the sub-mount (2). A further de-wetting layer (13) is deposited on a connecting side of the sub-mount (2) which is to be connected to the VCSEL chips (1). The de-wetting layers (13) are deposited with a patterned design or are patterned after depositing to define connecting areas (21) on the sub-mount (2) and the VCSEL chips (1). A solder (15) is applied to the connecting areas (21) of at least one of the two connecting sides. The VCSEL chips (1) are placed on the sub-mount (2) and soldered to the sub-mount (2) to electrically and mechanically connect the VCSEL chips (1) and the sub-mount (2). With the proposed method a high alignment accuracy of the VCSEL chips (1) on the sub-mount (2) is achieved without time consuming measures.

8 Claims, 3 Drawing Sheets

(51) Int. Cl.
    *H01S 5/30*     (2006.01)
    *H01S 5/42*     (2006.01)
    *H01S 5/024*    (2006.01)
    *H01L 23/00*    (2006.01)

(52) U.S. Cl.
    CPC ............ *H01S5/02272* (2013.01); *H01S 5/423* (2013.01); *H01S 5/02469* (2013.01); *H01S 5/028* (2013.01); *H01S 5/3013* (2013.01)

(56) References Cited

OTHER PUBLICATIONS

H. Roscher et al; "Small-Pitch Flip-Chip-Bonded VCSEL Arrays Enabling Transmitter Redundancy and Monitoring in 2-D 10 GBIT/S Space-Parallel Fiber Transmission", IEEE Journal of Selected Topics in Quantum Electronics, vol. 13, No. 5, Sep. 1, 2007, pp. 1279-1289, XP011194002.

K. Nieweglowski et al; "Demonstration of Board-Level Optical Link With Ceramic Ooptoelectronic Multi-Chip Module", Electronic Components and Technology Conf. May 26, 2009, pp. 1879-1886, XP031475178.

M. S. Bakir et al; "Sea of Leads Compliant I/O Interconnect Process Integration for the Ultimate Enabling of Chips With Low-$HBOX K$-Interlayer Dielectrics", IEEE Transactions on Advanced Packaging, vol. 28, No. 3, Aug. 1, 2005, pp. 488-494, XP011137222.

Ronny Bockstaele et al; "Realization and Characterization of 8 8 Resonant Cavity LED Arrays Mounted Onto CMOS Drivers for POF-Based Interchip Interconnections", IEEE Journal of Selected Topics in Quantum Electronics, vol. 5, No. 2, Apr. 1, 1999, XP011062485.

METHOD OF ASSEMBLING VCSEL CHIPS ON A SUB-MOUNT

FIELD OF THE INVENTION

The present invention relates to a method of assembling VCSEL chips (VCSEL: Vertical Cavity Surface Emitting Laser), in particular containing two-dimensional arrays of lasing emitters, on a sub-mount, in which the connection between the chips and the sub-mount is achieved by soldering.

BACKGROUND OF THE INVENTION

VCSEL IR power arrays allow tailored heating of a work piece by offering a tailored illumination pattern through a proper arrangement of the array. In specific applications e.g. when trying to create a very homogeneous illumination by projecting a superposition of magnified near-field images, a very accurate alignment (<5-10 µm) of the emission windows of the VCSEL chips with respect to each other is required. It is known that this high alignment accuracy when assembling the VSEL chips on a sub-mount can be achieved by performing active optical alignment. In this active optical alignment the lasers are activated and the emission is monitored by a camera during manipulation and placement of the chips. This is an expensive and time consuming method.

SUMMARY OF THE INVENTION

It is an object of the present invention to provide a method of assembling VCSEL chips on a sub-mount, which provides a high alignment accuracy of the chips without any time consuming measures.

The object is achieved with the method of present claim 1. Claim 10 relates to a VCSEL array device mounted according to the proposed method. Advantageous embodiments of the method and the device are subject matter of the dependent claims or can be deduced from the subsequent portions of the description and preferred embodiments.

In the proposed method a first de-wetting layer for a melted solder is deposited on a connecting side of the VCSEL chips which are to be connected to the sub-mount. A second de-wetting layer for the melted solder is deposited on the connecting side of the sub-mount which is to be connected to the VCSEL chips. The de-wetting layers are deposited with a patterned design or are patterned after depositing by locally removing material of the layer or by locally applying different material to define wetting connecting areas on the sub-mount and the VCSEL chips which are to be mechanically connected. The solder is applied to the connecting areas of at least one of the two connecting sides. The VCSEL chips are placed on the sub-mount and soldered at the connecting areas to the sub-mount to mechanically and in most cases also electrically connect the VCSEL chips and the sub-mount. During soldering the sub-mount and the VCSEL chips are not mechanically fixed to one another in order to allow a movement of the VCSEL chips on the sub-mount through surface tension forces of the melted solder.

The term sub-mount in this context relates to any base component to which the VCSEL chips are to be mounted and optionally also electrically connected. In a typical example, the sub-mount is a heat conducting plate which is then contacted with a heat sink to transport the heat generated by the VCSEL chips to the heat sink. The VCSEL chips may consist of single VCSEL's, one-dimensional arrays of VCSEL's or small two-dimensional arrays of VCSE's, in particular arrays with dimensions of between 0.5×0.5 mm$^2$ and 5×5 mm$^2$. The de-wetting layer is a material layer having a surface which is not wetted by the solder used for connecting the VCSEL chips to the sub-mount. In contrast to this, the contacting areas are formed of a material having a surface which is wetting the solder used for the connection. The de-wetting layer may already be deposited with a patterned design, for example using an appropriate lithography technique. In this case the layer or substrate to which the de-wetting layer is applied must already provide wetting properties for the used solder. The term patterning in this context means that through openings to the underlying substrate or layer are formed in the de-wetting layer, the through openings defining the contacting areas. Another possibility is to pattern the deposited de-wetting layer by locally removing material after depositing or by locally applying another material to the de-wetting layer which other material provides wetting properties for the melted solder. With this further material thus solder pads are formed on the de-wetting layer which are used for the later solder process. It is obvious for the skilled person that the material in the contacting areas must be selected to allow solder connections with the applied solder material.

With the above method self alignment of the VCSEL chips on the sub-mount occurs through the surface tension forces of the melted solder during soldering. By defining the connecting areas with a high accuracy, which is possible by known lithographic techniques when patterning the de-wetting layer, a high accuracy is also achieved in the alignment of the VCSEL chips on the sub-mount during soldering by said self alignment. The self alignment is created through the connecting areas with wetting properties and the areas inbetween that resist wetting when the solder is in the liquid phase, on both the VCSEL side as well as on the sub-mount side. The solder may be applied either on the sub-mount or on the VCSEL chips. Surface tension of the melted solder is then trying to minimize the surface (i.e. the free energy) and is hence pulling the single VCSEL chips to their proper location defined by the connecting areas.

The proposed method thus allows the alignment of the VCSEL chips on the sub-mount with a high accuracy only limited by the accuracy of defining the connecting areas, i.e. for patterning the de-wetting layer. The method does not require any expensive and time consuming active alignment.

The solder may be applied after the patterning of the de-wetting layer to the connecting areas of the sub-mount and/or to the connecting areas of the VCSEL chips. Preferably, the solder is pre-applied in form of a solder bump to the connecting areas. The VCSEL chips are then placed on the sub-mount and the sub-mount with the VCSEL chips is heated in an appropriate furnace in order to melt the solder and perform the soldering process.

The material for forming de-wetting layer is preferably selected from the group of Ti, TiW and Ni which form stable surface oxides. Oxidation occurs by exposure of the deposited layer of these materials to the ambient. The oxidation may also be accelerated by e.g. an oxygen plasma treatment or similar measures. Stable means that during soldering the formed surface oxides which provide the de-wetting properties are not reduced. Optimal de-wetting properties are achieved with de-wetting layers of Ti. Preferable materials for the solder used for mounting the VCSEL chips on the sub-mount are AuSn, AgSn or Indium. These materials are the basic components of the solder which may also have minor additions of other metals e.g. Cu in AgSn to influence the melting point or the reliability.

In a preferred embodiment VCSEL chips with bottom-emitter VCSEL's are soldered such that the top side of the VCSEL's, i.e. the side at which the mesas are formed, are connected to the sub-mount. Each chip preferably comprises a n-type substrate transparent for the laser radiation generated by the VCSEL's on which the mesas of the VCSEL's are formed which at least include the p-n junction and n- and p-DBR mirrors. The n-type substrate may also be replaced by a glass substrate or glass layer or another type of transparent substrate or layer, in particular if n-type material is not available which is transparent for the wavelength of the particular laser radiation. In the present patent application the term p-type mesa is used for mesa having an electrical p-contact, even though the mesa also contains n-type material. By depositing a metal layer prior to the deposition of the de-wetting layer, which metal layer forms the n-contacts of the VCSEL's, a conducting network can be formed between the p-type mesas of the VCSEL's for distributing the current equally over all p-mesas. So-called n-type mesas are formed by covering the mesas with an electrically isolating passivation layer, which at least needs to overlap over the p-n junction that is exposed after etching the mesas. An electrical connection to the n-contact is formed by a separate metal layer that both overlaps the n-contact layer and this mesa. Having a connection to the n-contact at the same height as the p-contacts allows electrically connecting VCSEL chips in series or in parallel without any wiring on the substrate side. With such a VCSEL array device formed with the proposed method microlens arrays may be placed very close or attached to the emitting surface of the VCSEL chips. This allows e.g. the superposition of magnified near-field images which is required for some applications like those already mentioned in the introductory portion of the description.

Another metal layer is applied overlapping the p-type mesas and the p-contacts. This layer may be applied in the same step as the formation of the layer making the connection to the n-contact. This metal layer mechanically stabilizes the mesas. Since this metal layer also covers the sides of the p-type mesas, the heat conduction to the sub-mount can be improved by forming the metal layer of a highly heat conducting material, preferably of Au or Cu. This is important for a maximum efficiency and output power of VCSEL power arrays in which the thermal conduction of the VCSEL chips to the heat sink needs to be minimized. By using sub-mounts of appropriate materials with high thermal conductivity, for example of silicon, AlN or diamond with thermal conductivities of 150 W/mK or above, a very low thermal resistance to an underlying heat sink is achieved which results in a maximum efficiency of the whole VCSEL array device.

A VCSEL array device assembled according to the proposed method thus comprises several VCSEL chips arranged side by side on a sub-mount, which may be attached to a heat sink. The VCSEL chips and the sub-mount are connected by solder connections formed between connecting areas on connecting sides of the VCSEL chips and the sub-mount. The connecting sides of the VCSEL chips and the sub-mount are the sides facing each other. The connecting areas are surrounded by de-wetting layers formed on each of connecting side. The device may also comprise further layers as described in connection with the proposed method.

These and other aspects of the invention will be apparent from and elucidated with reference to the embodiment(s) described hereinafter.

BRIEF DESCRIPTION OF THE DRAWINGS

The proposed method and corresponding VCSEL array device are described in the following by way of examples in connection with the accompanying figures in further detail. The figures show.

DETAILED DESCRIPTION OF EMBODIMENTS

Figure 1:
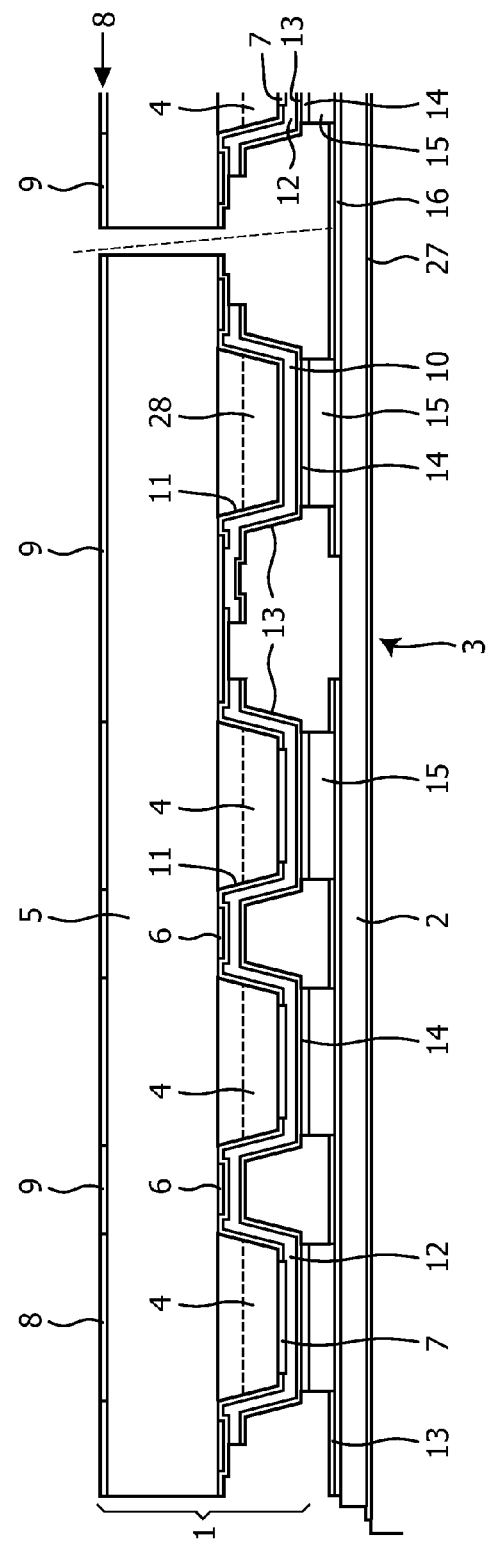
FIG. 1 a self aligned bottom-emitter VCSEL array device mounted according to the proposed method.

FIG. 1 shows an arrangement by which self alignment during soldering a bottom-emitter VCSEL chip 1 to a sub-mount 2 is achieved such that the emission windows of the VCSEL's of all chips on one sub-mount 2 are arranged in a desired exact manner with respect to each other. Each chip 1 comprises a VCSEL array of several VCSEL's from which three are shown with their p-type mesas 4 in FIG. 1. The figure shows the cross-section of one complete VCSEL chip 1 and only a small portion of a second chip at the right hand side. The VCSEL chips 1 comprise a n-type substrate 5 on which the p-type mesas 4 are formed in a known manner. The VCSEL's are connected by n-contacts 6 at the substrate side and p-contacts 7 on top of the mesas 4. The n-contacts 6 are metal layers having a low Ohmic contact (low Schottky barrier) to the n-type GaAs material of the substrate 5 or to the n-type DBR mirrors in case that mesa etching has stopped in these mirror layers (not shown in the figures). On the bottom emitting side of the substrate 5 opposing the p-type mesas 4 an additional metallization 9 is applied for minimizing the electrical resistance and to potentially serve as a reflector in case the device is e.g. used in a cavity to conserve the illumination power that has not been absorbed by a work piece. In this metallization 9 emission windows are formed to allow the emission of the generated laser radiation. These windows may include an antireflecting (AR) coating 8 to avoid internal reflections of the laser radiation. In FIG. 1, the mesa side of the VCSEL's is directed downwards to the sub-mount 2.

In the example of FIG. 1 the metal patterning is such that the VCSEL chips 1 are electrically connected in series, without bonding wires. A connection to the n-type material is realized by a galvanic metal layer 10 sitting on top of an isolating layer 11 and contacting the n-contact 6. This is shown at the n-type mesa 28 on the right hand side of the chip 1 which is not an active VCSEL emitter but only represents a supporting structure for supporting the chip on the sub-mount 2 and electrically connecting the adjacent chips 1 in series. The n-contact layer 6 forms a network between the p-type mesas 4 to reduce the electrical resistance and to facilitate an equal current distribution over all p-mesas.

A p-contact is achieved by p-contacts 7 (metal pads) on the VCSEL mesas 4. In this example a further galvanic metal layer 12 is overlapping the p-type mesas 4 and the p-contact 7. It is created at the same time with the metallization (metal layer 10) for the n-connection such that both metal layers are equally high. This can be seen on the left hand side of the FIG. 1 with the three p-type mesas 4. Metal layers 10 and 12 mechanically stabilize the mesas. Without these, the thermal mismatch stress, due to different thermal expansion coefficients, between the submount and the GaAs material, may cause the outer mesas to fracture.

These metal layers 10, 12 which are preferably made of Au or Cu which have a very high thermal conduction and electrical conduction, will also serve for maximizing heat conduction to the sub-mount 2 by increasing the GaAs surface that can release heat. The metal layer 12 may be formed of Au with a thickness between 0.1 to 3 µm and is finished with a de-wetting layer 13. Examples of materials for this de-wetting layer 13 are Ti, TiW or Ni, which form stable surface oxides that prevent the solder from wetting these layers. Thicknesses of such layers may range between 50 nm and 1 µm.

To allow a solder contact a wetting solder pad 14 is created on top of the mesas. This has to be done with a high accuracy which has to be better than the required alignment accuracy between the emission windows. An example for such a solder pad is layer stack of Ti/Pd/Au or a stack of Pd/Au on top of the layer stack of metal layer 12 and de-wetting layer 13. During soldering the top Au layer dissolves in the solder such that the underlying layer is exposed to the solder. As this layer may be de-wetting the solder the Pd acts as a barrier between the solder and the de-wetting layer. In the present example, these VCSEL chips 1 are soldered on sub-mounts 2 with a 5 µm pre-applied AuSn-solder 15.

Prior to the soldering process on the sub-mount side a de-wetting layer (13) is applied on top of a conducting metal layer 16, for example a 3 µm thick Au or Cu conduction layer. On top of this layer a thin Ti-layer is deposited to form the de-wetting layer 13. On top of this de-wetting layer 13 pads of Ti/Pt/AuSn solder where formed. The Ti/Pt-layer underneath the solder 15 serves as a barrier to prevent diffusion of the AuSn solder with the Au layer 16, as this is causing brittle alloys.

In FIG. 1 a portion of the formed device is shown in which the sub-mount 2 is additionally applied via a solder 27 to a heat sink 3. Typically this solder 27 has a lower melting point that the solder 15 used for solder the VCSEL. The sub-mount 2 is preferably formed of a highly heat conduction material like AlN and serves as a heat spreader.

In an alternative embodiment AgSn bumps 19 are used for soldering. The advantage of AgSn is the lower melting temperature which results in reduced thermal mismatch stress from the difference in thermal expansion coefficients between a AlN sub-mount 2 and the GaAs of the VCSEL chips 1. A Cu solder pad 17 is used in connection with a TiW de-wetting layer 18. AgSn bump 19 thicknesses of 5, 10 and 20 µm have been successfully used. A 5 µm height of the solder pumps 19 has preference because the thermal resistance is minimized.

Figure 2:
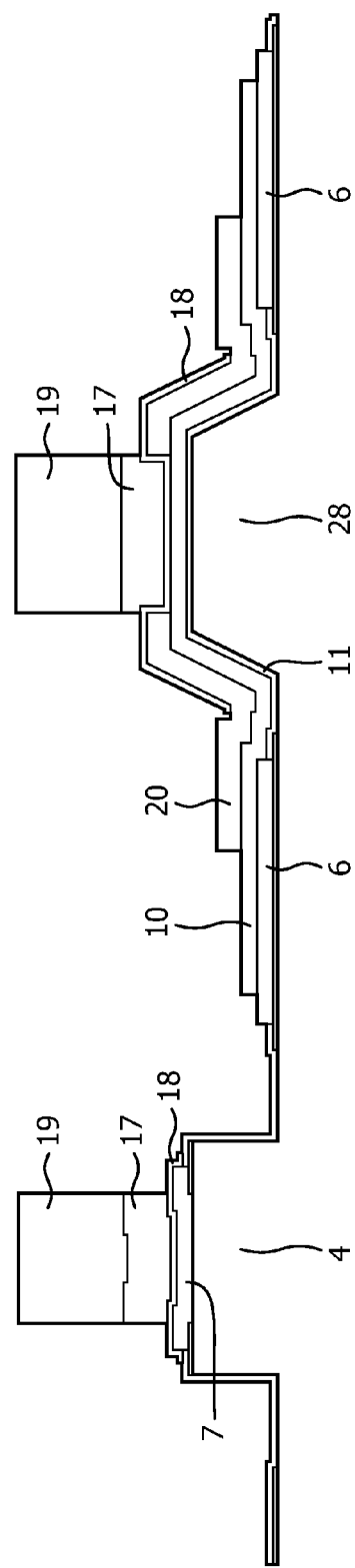
FIG. 2 an example of the layer structure of a self aligned bottom-emitter VCSEL chip prepared for mounting according to the proposed method.

FIG. 2 shows one of the VCSEL's of the chip 1 on the left hand side and the n-type mesa 28 on the right hand side. The n-type mesa 28 may be formed as a bar extending in the direction perpendicular to the paper plane, but also of any other shape. The figure shows the layer structure after bump formation. On top of the p-type mesa 4 the TiW-de-wetting layer 18 is shown on the p-contact pad 7. On this de-wetting layer the Cu-solder pad 17 is formed on which the SnAg-bump 19 is deposited. On the right hand side the n-contact 6, the isolating layer 11, the metal layer 10 connecting to the n-contact 6 and the de-wetting layer 18 are shown (see also FIG. 1). An additional galvanic Au layer 20 has been applied in this example in order to strengthen the structure. This additional layer can also be omitted. In the same manner as on the left hand side the Cu-solder pad 17 is formed on the de-wetting layer 18 and the SnAg bump 19 is applied to this solder pad 17.

Figure 3:
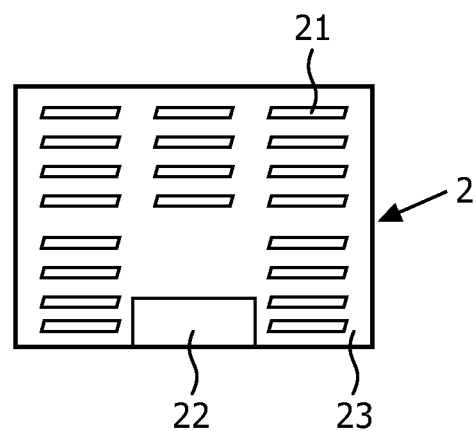
FIG. 3 an example of the layer structure of a sub-mount prepared for mounting of the VCSEL chips according to the proposed method.
Figure 3:
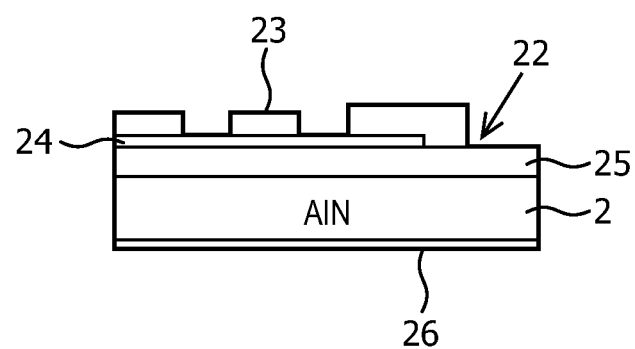

The sub-mount side is shown in FIG. 3. This figure shows a cross sectional view at the bottom and a top view at the top. In the top view of the sub-mount the connecting areas 21 can be recognized. These connecting areas 21 are formed by through openings in the de-wetting layer 23 of Ti to the underlying (wetting) layer stack 24 of Ti/Pt with a preferable thickness of the Pt layer of at least 0.2 µm to prevent diffusion of solder into the thick Au layer underneath. A layer structure of the sub-mount 2 of AlN can be seen in the lower portion of the figure. At the back side of this sub-mount 2 a layer stack 26 of Ti/Pt/Au is formed which serves for better wetting conditions when soldering the sub-mount on e.g. a Cu heat-sink. Such a layer may also be applied to the sub-mount in the example of FIG. 1. On top of the sub-mount a layer stack 25 of Ti/Pd/Au is applied. The Au layer portion has preferable a thickness of 3 µm for sufficiently low sheet resistance. On top of this layer 25 the wetting layer 24 is applied portions of which form the above mentioned connecting areas 21. On top of this wetting layer the de-wetting layer 23 of Ti is applied in a patterned structure in order to provide the openings to the wetting layer to form the connecting areas 21. The Au surface of the layer 25 applied directly to the sub-mount 2 is also visible in one clearly defined area from the top of the sub-mount. This area serves as pads for wire-bonding but also forms a visual marker 22 for placing the VCSEL chips and for a later handling of the VCSEL array device.

While the invention has been illustrated and described in detail in the drawings and foregoing description, such illustration and description are to be considered illustrative or exemplary and not restrictive; the invention is not limited to the disclosed embodiments.

For example, it is also possible to operate the invention in an embodiment wherein the submount provides further layers or electronic components or in which the VCSEL chips have a different design. The layers which are formed according to the proposed method may not only be single layers but also layer stacks, e.g. in case of the layers for the n-contact and the p-contact. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. In particular, all dependent claims of the method can be freely combined. Any reference signs in the claims should not be construed as limiting the scope.

LIST OF REFERENCE SIGNS

1 VCSEL chip
2 sub-mount
3 heat sink
4 p-type mesa
5 n-type substrate
6 n-contact
7 p-contact
8 AR-coating
9 metallization
10 metal layer (n)
11 isolating layer
12 metal layer (p)
13 de-wetting layer
14 solder pad
15 solder
16 conduction layer
17 Cu solder pad
18 TiW de-wetting layer
19 SnAg bump
20 galvanic Au layer
21 connecting areas
22 visual marker
23 de-wetting layer 24 Ti/Pt layer
25 layer of Ti/Pd/Au
26 layer of Ti/Pt/Au
27 solder
28 n-type mesa

The invention claimed is:

1. A method of assembling VCSEL chips on a sub-mount comprising the following steps:
forming p-type mesas by providing electrical p-contacts on top of the mesas,
forming a n-type mesa by covering a mesa with an electrically isolating passivation layer overlapping at least over a p-n junction of the mesa,
depositing a de-wetting layer on a connecting side of the VCSEL chips,
depositing a further de-wetting layer on a connecting side of the sub-mount,
said de-wetting layers being deposited with a patterned design or being patterned after deposition to define corresponding connecting areas on the sub-mount and the VCSEL chips which connecting areas provide a wetting surface for a solder,
applying the solder to the connecting areas of at least one of the two connecting sides,
placing the VCSEL chips on the sub-mount and soldering the VCSEL chips to the sub-mount without fixing the VCSEL chips relative to the sub-mount to allow a movement of the VCSEL chips on the sub-mount through surface tension forces of the melted solder, wherein the VCSEL chip comprises a bottom-emitter VCSEL array which is soldered with its mesa side to the sub-mount
wherein prior to the deposition of the de-wetting layer on the connecting side of the VCSEL chips a first metal layer is deposited which is electrically connecting to the n-contacts of the VCSELs and overlapping the n-type mesa, said n-contacts forming a conducting network between p-type mesas of the VCSELs for electrically connecting the VCSELs and distributing the current equally over the p-type mesas,
wherein a second metal layer is deposited at the same time as the first metal layer to overlap the p-type mesas and p-contacts, the first metal layer and the second metal layer mechanically stabilizing the VCSEL chips such that an electrical connection to the n-contact is at the same height as the p-contacts.

2. The method according to claim 1,
wherein the solder is pre-applied as a solid layer to the connecting areas of at least one of the two connecting sides.

3. The method according to claim 1,
wherein prior to depositing the de-wetting layer on the sub-mount an electrically conducting layer is deposited on the connecting side of the sub-mount.

4. The method according to claim 1,
wherein the de-wetting layer is formed by depositing Ti, TiW or Ni which form stable surface oxides.

5. The method according to claim 1,
wherein the patterning of the de-wetting layer is performed by locally removing the de-wetting layer or by locally depositing a material forming a wetting layer at the connecting areas.

6. The method according to claim 1,
wherein AuSn, AgSn or Indium are used as components of the solder for connecting the VCSEL chips with the sub-mount.

7. A VCSEL array device comprising several VCSEL chips arranged side by side on a sub-mount, the VCSEL chips and sub-mount being connected by solder connections formed between connecting areas on connecting sides of the VCSEL chips and the sub-mount,
wherein the connecting areas are surrounded by de-wetting layers formed on the connecting sides of the VCSEL chips and the sub-mount
wherein the VCSEL chip comprises a bottom-emitter VCSEL array which is soldered with its mesa side to the sub-mount,
wherein the VCSEL chip comprises p-type mesas with electrical p-contacts on top of the mesas,
wherein the VCSEL chip comprises a n-type mesa being covered with an electrically isolating passivation layer overlapping at least over a p-n junction of the mesa,
wherein the VCSEL chip comprises underneath the de-wetting layer on the connecting side of the VCSEL chips a first metal layer which is electrically connecting to the n-contacts of the VCSELs and overlapping the n-type mesa, said n-contacts forming a conducting network between p-type mesas of the VCSELs for electrically connecting the VCSELs and distributing the current equally over the p-type mesas,
wherein the VCSEL chip comprises a second metal layer underneath the de wetting layer overlapping the p-type mesas and p-contacts, the first metal late and the second metal layer mechanically stabilizing the VCSEL chips such that an electrical connection to the n-contact is at the same height as the p-contacts.

8. The device according to claim 7, wherein the sub-mount is mounted on a heat-sink.

* * * * *